United States Patent
Tolson et al.

(10) Patent No.: US 6,628,960 B1
(45) Date of Patent: Sep. 30, 2003

(54) MULTI-MODE RADIO RECEIVER

(75) Inventors: Nigel James Tolson, Berkshire (GB); Stuart Parrott, Berkshire (GB)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/401,121

(22) Filed: Sep. 22, 1999

(30) Foreign Application Priority Data

Sep. 25, 1998 (GB) .............................................. 9820793

(51) Int. Cl.⁷ .............................. H04B 1/38; H04M 1/00
(52) U.S. Cl. ....................... 455/552; 455/314; 455/339; 455/141; 370/319
(58) Field of Search ................................ 455/314, 315, 455/553, 188.1, 189.1, 190.1, 180.1, 191.3, 552, 338, 339, 334, 141; 370/330, 335–337, 319–321

(56) References Cited

U.S. PATENT DOCUMENTS

| | | | | |
|---|---|---|---|---|
| 5,392,460 A | * | 2/1995 | Mattila et al. ................. | 455/76 |
| 5,537,676 A | * | 7/1996 | Panther ....................... | 455/315 |
| 5,668,837 A | | 9/1997 | Dent | |
| 5,732,330 A | * | 3/1998 | Anderson .................... | 455/76 |
| 5,774,017 A | * | 6/1998 | Adar ........................... | 330/51 |
| 5,890,051 A | * | 3/1999 | Schlang et al. .............. | 455/76 |
| 5,898,907 A | * | 4/1999 | Maruyamam ................ | 455/76 |
| 5,974,305 A | * | 10/1999 | Matero .................... | 455/188.1 |

* cited by examiner

Primary Examiner—Vivian Chin
Assistant Examiner—Charles Craver
(74) Attorney, Agent, or Firm—Sughrue Mion, PLLC

(57) ABSTRACT

A radio receiver having a selectable first downconverter stage for each mode to convert radio frequencies to intermediate frequencies, a second downconverter stage to convert the intermediate frequencies to baseband frequencies, said second downconverter stage being common to both modes, and channel selection at baseband frequencies by means of re-configurable filtering. A radio receiver having a selectable first downconverter stage for each mode to convert radio frequencies to intermediate frequencies, a second downconverter stage to convert the intermediate to baseband frequencies, said second downconverter stage being common to all modes, and channel selection at baseband frequencies by means of re-configurable filtering.

2 Claims, 3 Drawing Sheets

MULTI-MODE RADIO RECEIVER

BACKGROUND OF THE INVENTION

1. Field of the Invention

This invention relates to radio receivers and in particular, though not exclusively, it relates to radiotelephone receivers operable with different types of multiple access networks.

2. Description of the Related Art

Reference is made to the paper on "Recent Advances in RF Integrated Circuits" by Behzad Razavi published in IEEE Communications Magazine December 1997 for a description of the prior art and technological background relating to transmitter/receiver architectures.

The following abbreviations and terms are used herein:

GSM: Global System for Mobile communications, (formerly Groupe Special Mobile)
W-CDMA: Wide band code division multiple access
TDMA: Time division multiple access
FDD: Frequency division duplex
UMTS: Universal mobile telecommunications system
FDMA: Frequency division multiple access
DUAL MODE: A receiver designed to operate with two networks, each network having a different type of multiple access.
MULTI-MODE: A receiver designed to operate with more than two networks each network having a different type of multiple access.
RF: Radio frequency
IF: Intermediate frequency A TDMA system such as GSM has its allocated bandwidth divided into channels, 200 kHz for GSM, with users sharing time within each channel by the allocation of a time slot. The receiver for this TDMA system must therefore select a 200 kHz channel. For W-CDMA, However, the whole of the allocated bandwidth is received and multiple access is provided by code division. One such W-CDMA system is UMTS.

It is convenient for a single transceiver to be capable of operation with both TDMA and W-CDMA systems. In order to achieve such dual mode operation two separate receivers could be installed within the same telephone housing. A dual mode receiver such as will be described is not limited to the TDMA and W-CDMA modes and may for example be configured for reception of FDMA arid TDMA or FDMA and W-CDMA.

A dual mode receiver in which some stages of the receiver can be used for reception in e.g. both TDMA and W-CDMA modes would provide a significant reduction in the number and cost of components and in the volume of the receiver part of the phone. If the need for the SAW(Surface Acoustic Wave) filters commonly used at IF can be avoided implementation of the receiver will be greatly simplified.

SUMMARY OF THE INVENTION

It is an object of the present invention to provide a multi-mode receiver having some receiver stages common to all modes of reception and providing also good performance in both operating modes. A further object of the invention is to remove the need for SAW filters at IF so as to allow implementation of the receiver as an ASIC (Application Specific Integrated Circuit).

According to one aspect of the invention there is provided a dual mode radio receiver having a selectable first downconverter stage for each mode to convert RF to IF, a second downconverter stage to convert IF to baseband frequencies, said second downconverter stage being common to both modes, and channel selection at baseband frequencies by means of re-configurable filtering.

The invention may be extended to provide a multi-mode receiver wherein reception may be selected from more than two multiple access modes.

According to a second aspect of the invention there is provided a multi-mode radio receiver having a selectable first downconverter stage for each mode to convert RF to IF, a second downconverter stage to convert IF to baseband frequencies, said second downconverter stage being common to all modes, and channel selection at baseband frequencies by means of re-configurable filtering.

The above and other objects, features, and advantages of the present invention will become apparent from the following description when taken in conjunction with the accompanying drawings which illustrate a preferred embodiment of the present invention by way of example.

DETAILED DESCRIPTION OF THE PREFERRED EMBODIMENTS

One example of the invention will now be described with reference to the figures.

There are significant advantages in implementing a broadband IF structure whereby the whole receive band is mixed down to IF and the required channel separation obtained by filtering at baseband. A SAW filter usually necessary for filtering at IF could be eliminated and a more flexible frequency plan allowed. Design of a dual mode GSM/W-CDMA radio receiver is complicated, however, by the differing requirements for the two receiver types.

The GSM specification requires a high level of in-band blockers giving rise to a maximum in-band level of −23 dBm. As there is no IF filtering for in-band blockers the maximum level will be −23 dBm plus the net gain of the LNA(Low Noise Amplifier) and first mixing stages. In order to avoid unacceptably high levels of unwanted intermodulation products a good performance from the second downconverter stage is essential. A high bias current is therefore necessary in the I(In-phase) and Q(Quadurature) second mixing stages for GSM operation.

For W-CDMA the maximum in-band blocker is −55 dBm and the performance needed from the second downconverter stage to achieve the required level of unwanted intermodulation products is considerably reduced. A much lower bias current than for GSM can therefore be used for the I and Q second mixing stages in W-CDMA mode. Furthermore, in order for the receiver to continue to operate for a reasonable amount of time in continuous FDD operation in W-CDMA it is necessary for a low receiver current to be demanded.

Figure 1:
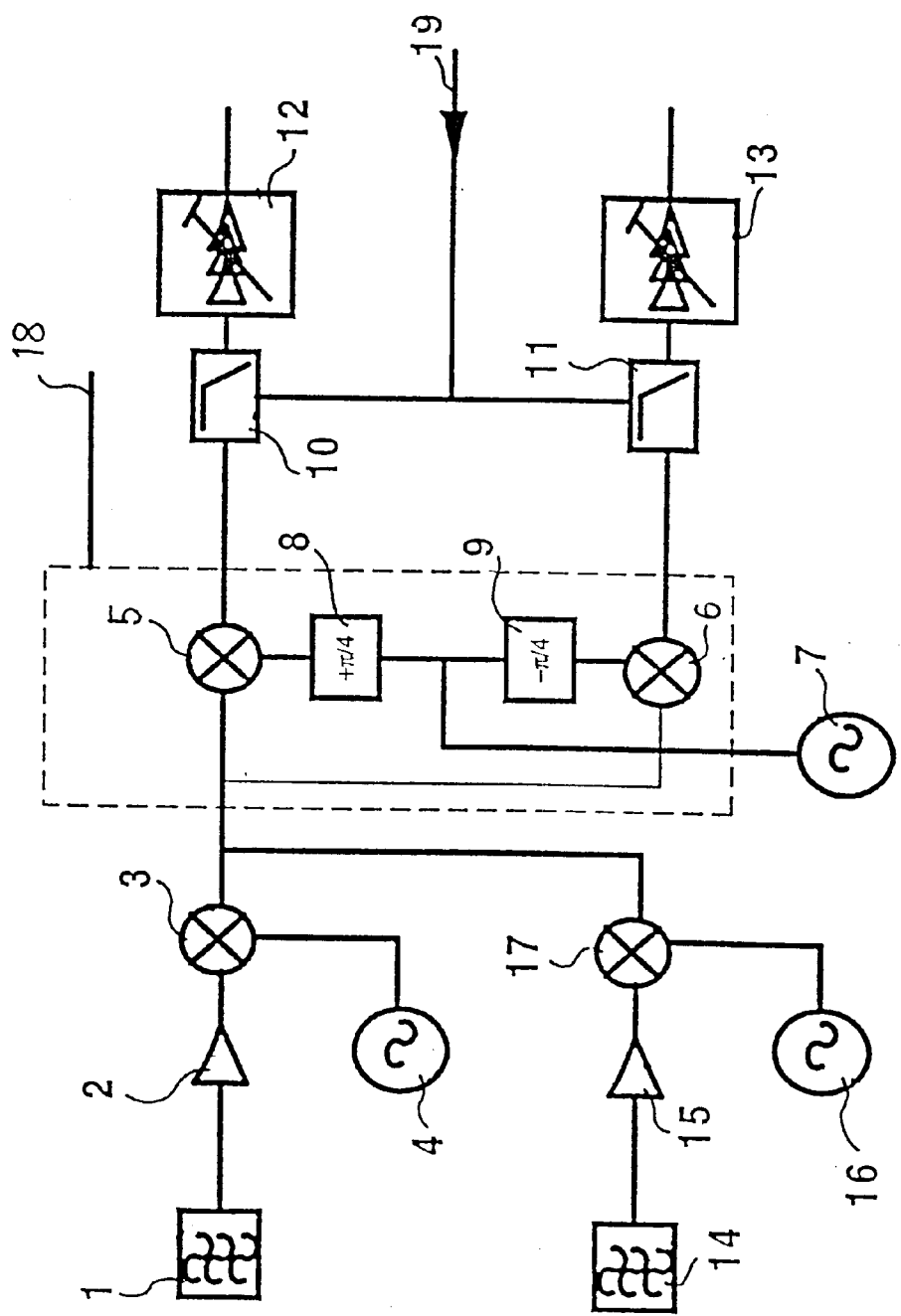
FIG. 1 is a block diagram of the receiving section of a dual mode radiotelephone.

With reference to FIG. 1, a block diagram of part of a dual mode radio receiver is shown. The first down-conversion stages for each mode are separate and these first stages are selected for the appropriate mode of operation. With the receiver selected to operate in the GSM mode incoming RF from an antenna is filtered in pre-selection filter 1 and the output from pre-selection filter 1 is fed via low noise amplifier (LNA) 2 to a first mixer 3.

The output from local oscillator (LO) 4 is mixed in mixer 3 with the RF signal to provide an intermediate frequency (IF), the IF being supplied as an input to both mixer 5 and mixer 6. A LO signal from LO 7 is advanced in phase by a quarter wavelength in phase shifter 8 and fed to mixer 5 where it is mixed with the IF to produce an in phase (I) signal at baseband frequencies. The LO frequency from LO 7 is also retarded in phase by a quarter wavelength in phase shifter 9 and supplied to mixer 6 to produce a quadrature output (Q) at baseband.

The requirements for GSM, supra, regarding the need for good linearity in the mixer stages 5 and 6 are fuffilled by the program bias 18 setting the second mixer stage to the higher current operation needed to achieve satisfactory operation in the mixers.

Channel selection is effected in low pass filters 10 and 11. The baseband frequencies are passed through I and Q filters 10 and 11. Filters 10 and 11 are low pass filters, the pass band being selected by control signal 19 in accordance with the mode of operation and the assigned operating channel. For W-CDMA operation wideband filters such as 2.5 MHz are selected. For TDMA, however a selectable 200 kHz channel is used and the filters 10 and 11 are configured to provide a 200 kHz passband for the assigned channel.

Figure 2:
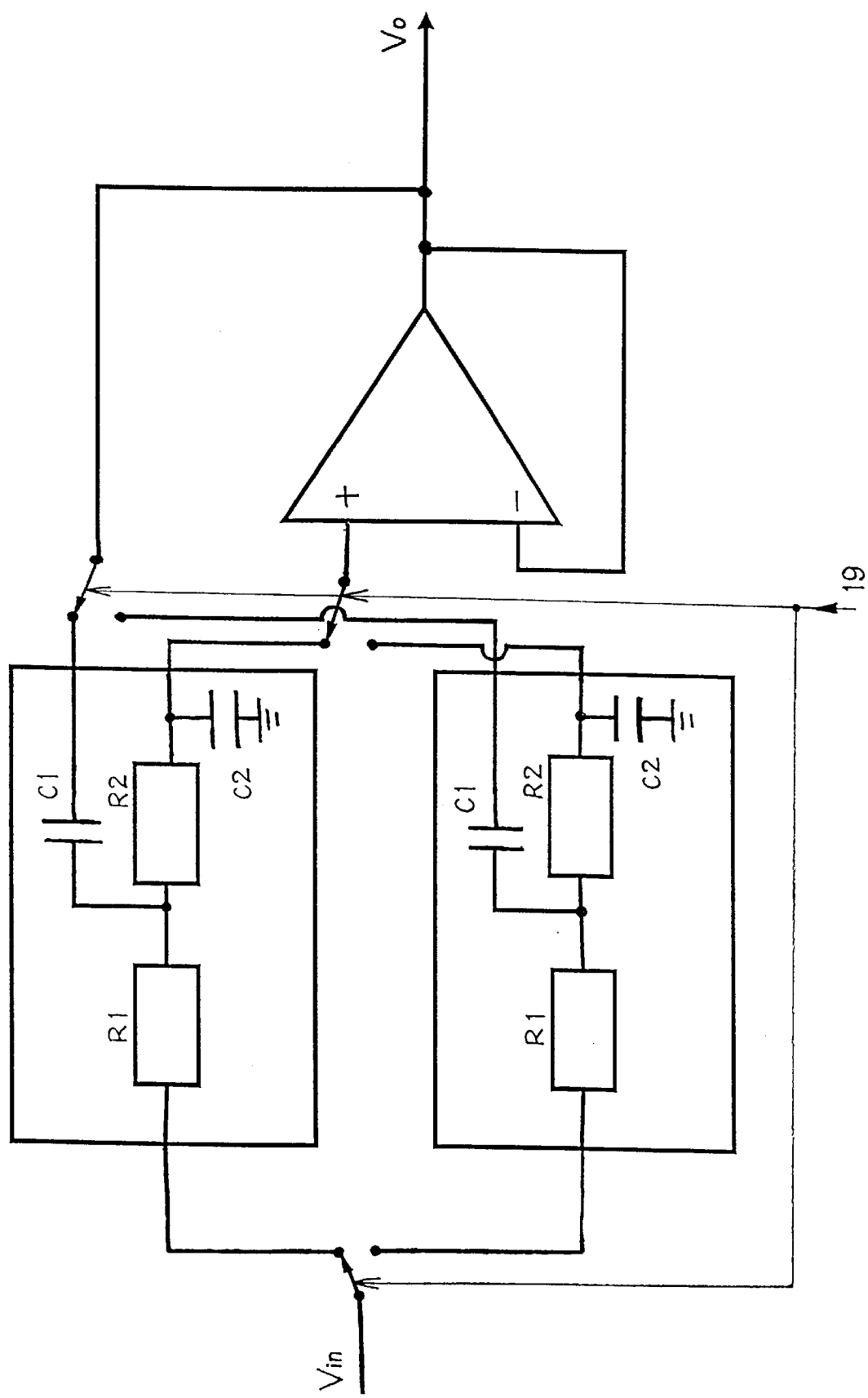
FIG. 2 is an active low pass filter circuit.

As shown FIG. 2, the filters are re-configured by selection of circuit components based on control signal 19. The (−3 dB) low frequency cutoff f0 for the active filter shown in FIG. 2, for example is given by the equation $$f_0 = 1/[2\pi C2(R1R2)^{1/2}]$$

Selection of the values of C2, R1 and R2 will therefore determine f0.

For filters 10 and 11, the number of configurations to accommodate the modes and possible channel assignments is known in advance. The means for selecting the circuit values for the filter components can therefore be optimised at the design stage. The filters 10 and 11 may be implemented as MMIC (Monolithic Microwave IC) active filters. A description of an MMIC active filter can be found in IEEE Transactions on microwave theory and techniques, Volume 37, number 12, December 1989, Manfred J. Schindler and Yusuke Tajima.

The filtered outputs from filters 10 and 11 are fed to amplifiers 12 and 13 and then to standard processing circuits such as are well known in the art, see for example "Mobile Radio Communications" published by John Wiley & Sons, Raymond Steele (Ed.)

On selection of the W-CDMA mode of operation, incoming RF from an antenna is fed via pre-selection filter 14 and LNA 15 to mixer 17. The output from LO 16 is mixed in mixer 17 and the IF output from mixer 17 is fed to the second stage mixers 5 and 6. A LO signal from LO 7 is advanced in phase by a quarter wavelength in phase shifter 8 and fed to mixer 5 where it is mixed with the IF to produce an in phase (I) signal at baseband frequencies. The LO frequency from LO 7 is also retarded in phase by a quarter wavelength in phase shifter 9 and supplied to mixer 6 to produce a quadrature output (Q) at baseband.

On selection of the W-CDMA mode of operation, the programmably variable bias 18 is set to low current and the re-configurable filters 10 and 11 are configured for wideband operation by control signal 19.

Figure 3:
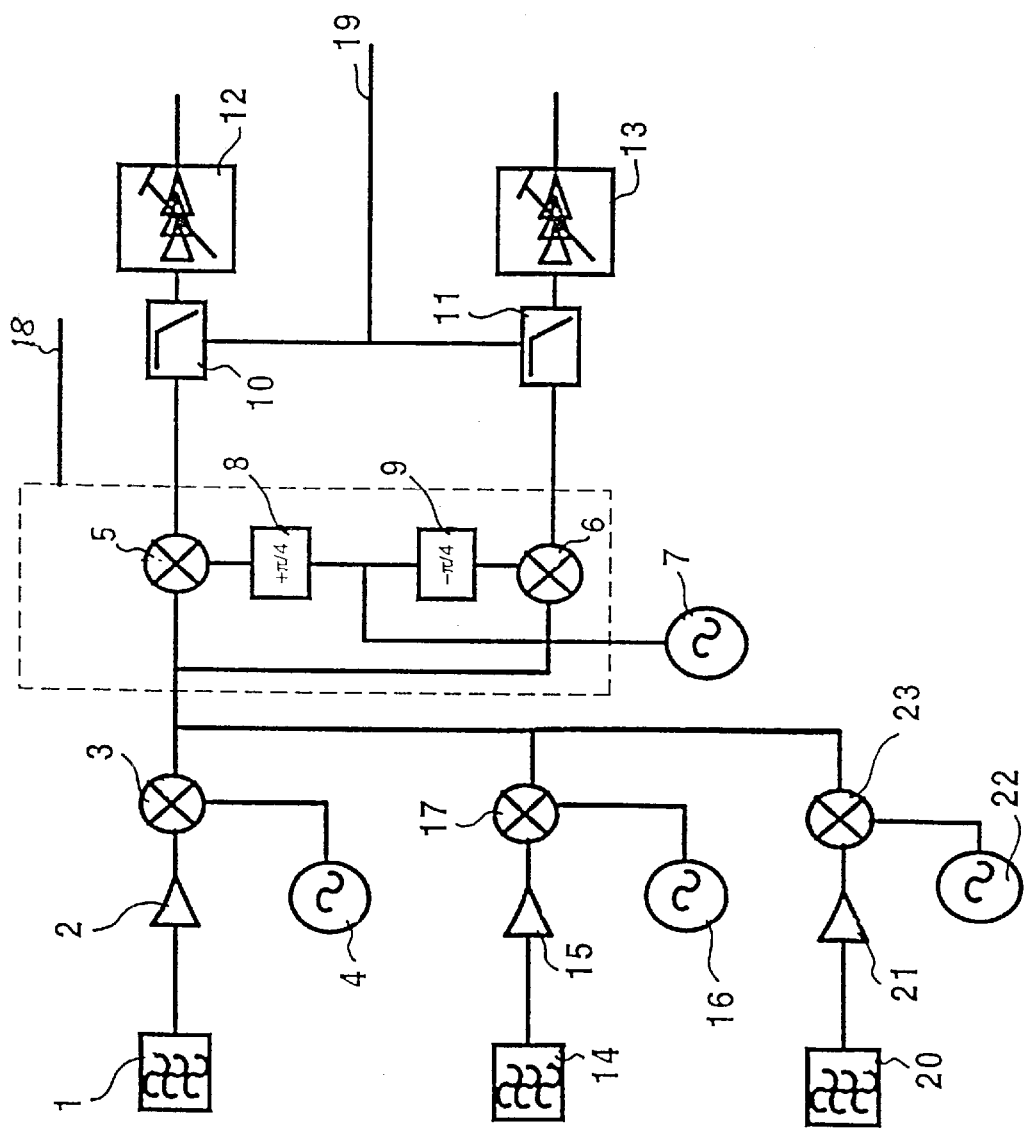
FIG. 3 is a block diagram of the receiving section of a multi-mode radiotelephone.

With reference to FIG. 3 which is a block diagram of the receiving section of a multi-mode radiotelephone, the previously described TDMA/W-CDMA dual mode receiver has been extended to include FDMA reception.

On selection of the FDMA mode of operation incoming RF from an antenna is fed via pre-selection filter 20 and LNA 21 to mixer 23. The output from LO 22 is mixed in mixer 23 and the IF output from mixer 23 is fed to the second stage mixers 5 and 6. Program bias 18 is set and filters 10 and 11 are re-configured for FDMA mode.

The second downconverter stage comprising mixers 5 and 6, phase shifters 8 and 9 and LO 7 is common to all modes of operation and there is no SAW filter at IF.

Although a certain preferred embodiment of the present invention has been shown and described in detail, it should be understood that various changes and modifications may be made therein without departing from the scope of the appended claims.

What is claimed is:

1. A radio receiver comprising:
   a first downconverter stage operable to selectable convert each of a plurality of radio frequencies to intermediate frequencies, wherein the plurality of radio frequencies comprise frequencies associated with a plurality of different modes; and
   a second downconverter stage operable to convert the intermediate frequencies to baseband frequencies, wherein said second downconverter stage is common to each of the different modes, and wherein further, said second downconverter stage comprises at least a filter and an amplifier,
   wherein the plurality of different modes are each multiple access modes consistent with respective multiple access networks.

2. A radio receiver as claimed in claim 1, wherein the multiple access modes comprise TDMA, CDMA, FDMA, and W-CDMA.

* * * * *

UNITED STATES PATENT AND TRADEMARK OFFICE
CERTIFICATE OF CORRECTION

PATENT NO. : 6,628,960 B1
DATED : September 30, 2003
INVENTOR(S) : Nigel James Tolson and Stuart Parrott It is certified that error appears in the above-identified patent and that said Letters Patent is hereby corrected as shown below:

Title page,
Item [30], Foreign Application Priority Data, change "9820793" to -- 9820793.9 --.

Signed and Sealed this

Seventh Day of June, 2005

JON W. DUDAS
*Director of the United States Patent and Trademark Office*